United States Patent
Xia et al.

(10) Patent No.: US 11,060,950 B1
(45) Date of Patent: Jul. 13, 2021

(54) SYSTEMS AND METHODS FOR IDENTIFYING LOCATIONS OF DEPLOYED FIBER CABLES BASED ON VIBRATIONS

(71) Applicant: Verizon Patent and Licensing Inc., Arlington, VA (US)

(72) Inventors: Tiejun J. Xia, Richardson, TX (US); Glenn A Wellbrock, Wylie, TX (US); Ting Wang, Windsor, NJ (US); Ming-Fang Huang, Princeton, NJ (US)

(73) Assignees: Verizon Patent and Licensing Inc., Basking Ridge, NJ (US); NEC Laboratories America, Inc., Princeton, NJ (US)

( * ) Notice: Subject to any disclaimer, the term of this patent is extended or adjusted under 35 U.S.C. 154(b) by 0 days.

(21) Appl. No.: 16/813,257

(22) Filed: Mar. 9, 2020

(51) Int. Cl.
*G01M 11/00* (2006.01)
*G01H 9/00* (2006.01)
(Continued)

(52) U.S. Cl.
CPC ..... *G01M 11/3145* (2013.01); *G01D 5/35361* (2013.01); *G01H 9/004* (2013.01);
(Continued)

(58) Field of Classification Search
CPC .. G01M 11/30; G01M 11/31; G01M 11/3109; G01M 11/3118; G01M 11/3127; G01M 11/3136; G01M 11/3145; G01M 11/3154; G01M 11/3163; G01M 11/3172; G01M 11/3181; G01M 11/319; G01M 11/33; G01M 11/331; G01M 11/332; G01M 11/333; G01M 11/334; G01M 11/335; G01M 11/336; G01M 11/337; G01M 11/338; G01H 9/002; G01R 31/08; G01R 31/081; G01R 31/083; G01R 31/086;
(Continued)

(56) References Cited

U.S. PATENT DOCUMENTS

| 7,800,743 | B1 * | 9/2010 | Huffman | ................ | H04B 10/85 |
| | | | | | 356/73.1 |
| 8,937,713 | B2 * | 1/2015 | Huffman | ................ | G01H 9/004 |
| | | | | | 356/73.1 |

(Continued)

OTHER PUBLICATIONS

"Verizon and NEC just made fiber sensing a whole lot easier", Verizon News Release, for immediate release Oct. 7, 2019.
(Continued)

*Primary Examiner* — Gordon J Stock, Jr.

(57) ABSTRACT

A device may receive, from a sensor device, cable distance data identifying cable distances along a fiber cable to vibrations experienced by the fiber cable, and may receive location data identifying locations associated with the vibrations. The device may correlate the cable distance data and the location data to generate correlated location data, and may store the correlated location data in a data structure. The device may receive, from the sensor device, data identifying a cable distance along the fiber cable to an alarm condition associated with the fiber cable, and may determine a location of the alarm condition based on the correlated location data and the data identifying the cable distance along the fiber cable to the alarm condition. The device may perform actions based on the alarm location.

20 Claims, 10 Drawing Sheets

(51) Int. Cl.
*G01R 31/08* (2020.01)
*H04B 10/071* (2013.01)
*G05D 1/02* (2020.01)
*H04B 10/032* (2013.01)
*H04B 10/038* (2013.01)
*G01D 5/353* (2006.01)
*G02B 6/44* (2006.01)

(52) U.S. Cl.
CPC .......... *G01R 31/086* (2013.01); *G05D 1/021* (2013.01); *H04B 10/032* (2013.01); *H04B 10/038* (2013.01); *H04B 10/071* (2013.01); *G02B 6/4467* (2013.01); *G05D 2201/02* (2013.01)

(58) Field of Classification Search
CPC .... G01R 31/11; G05D 1/021; G05D 2201/02; H04B 10/03; H04B 10/032; H04B 10/034; H04B 10/038; H04B 10/07; H04B 10/071; G02B 6/4463; G02B 6/4467; G02B 6/4469; G02B 6/447; G01L 1/24; G01L 1/242; G01D 5/353; G01D 5/35338; G01D 5/35341; G01D 5/35345; G01D 5/35348; G01D 5/35351; G01D 5/35354; G01D 5/35358; G01D 5/35361; G01D 5/35364; G01D 5/35367; G01D 5/3537; G01D 5/34374

See application file for complete search history.

(56) References Cited

U.S. PATENT DOCUMENTS

| | | | |
|---|---|---|---|
| 10,075,232 B1* | 9/2018 | Salgueiro | H04B 10/071 |
| 10,650,648 B2* | 5/2020 | Englund | H04R 23/008 |
| 2007/0264012 A1* | 11/2007 | Healey | H04B 10/079 398/13 |
| 2008/0144016 A1* | 6/2008 | Lewis | G01H 9/004 356/73.1 |
| 2015/0098673 A1* | 4/2015 | Barfoot | G01V 8/24 385/13 |
| 2017/0146409 A1* | 5/2017 | Hadley | G01K 3/10 |
| 2019/0197846 A1* | 6/2019 | Englund | G08B 13/186 |
| 2020/0124735 A1* | 4/2020 | Huang | G01V 1/001 |
| 2020/0191613 A1* | 6/2020 | Englund | G08B 13/1672 |
| 2020/0200592 A1* | 6/2020 | Huang | G01H 9/004 |
| 2020/0313763 A1* | 10/2020 | Wang | H04B 10/27 |

OTHER PUBLICATIONS

Huang, et al., "First Field Trial of Distributed Fiber Optical Sensing and High-Speed Communication Over an Operational Telecom Network", Journal of Lightwave Technology, vol. 38, No. 1, Jan. 1, 2020, pp. 75-81.

Wellbrock, et al., "First Field Trial of Sensing Vehicle Speed, Density, and Road Conditions by Using Fiber Carrying High Speed Data", 2019 Optical Fiber Communications Conference and Exhibition (OFC), IEEE, pp. 1-3.

* cited by examiner

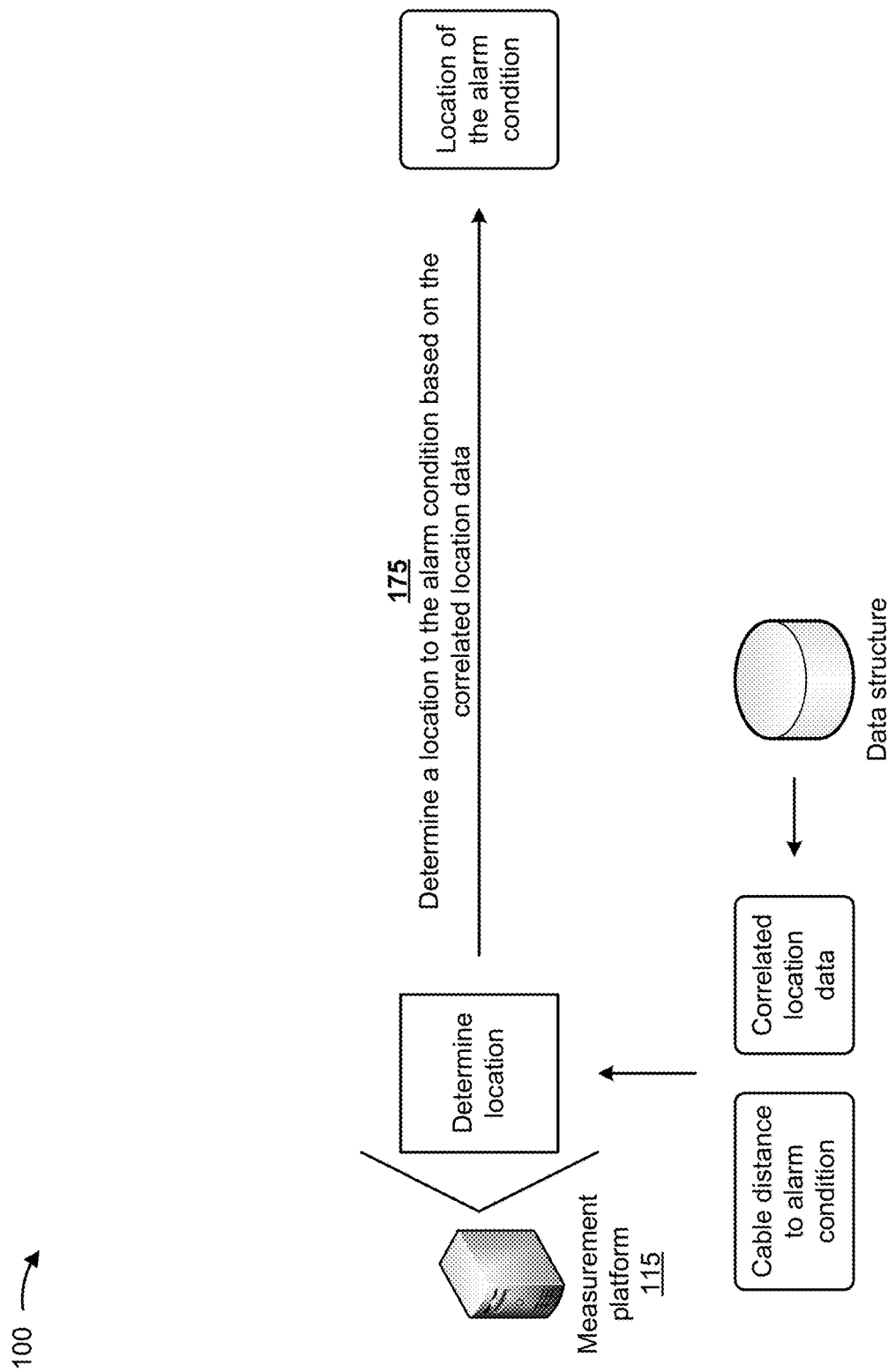

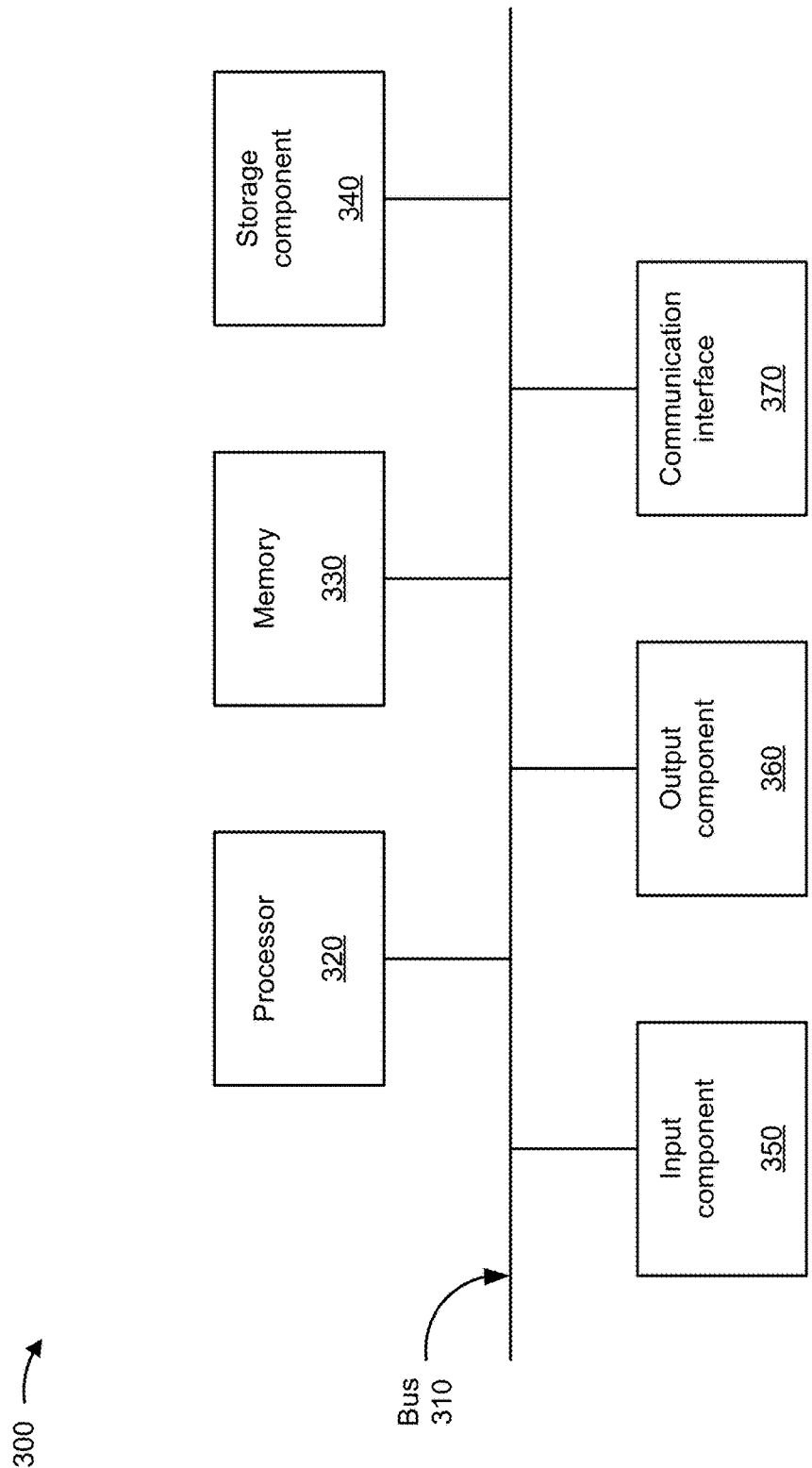

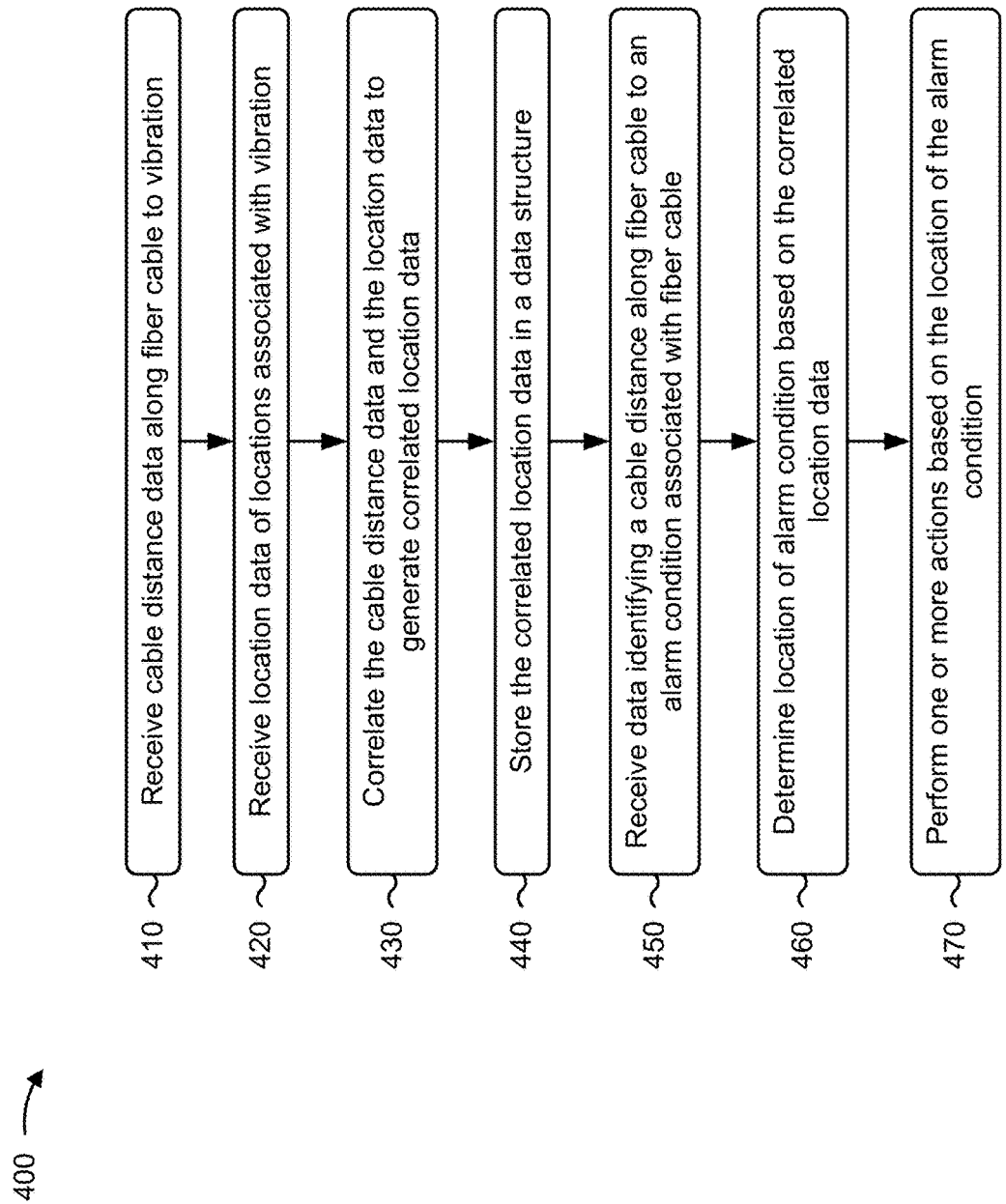

SYSTEMS AND METHODS FOR IDENTIFYING LOCATIONS OF DEPLOYED FIBER CABLES BASED ON VIBRATIONS

BACKGROUND

To maintain an integrity of deployed fiber cables, network service providers need to repair fiber cable problems in the field, such as a fiber cut, high loss splice points, tightly bending points, and/or the like. When a deployed fiber cable experiences a fault (e.g., a fiber cut), a field technician may be deployed to correct the issue. The field technician needs to identify a location of the fault quickly so that the field technician may travel to the location and correct the fault in the fiber cable.

BRIEF DESCRIPTION OF THE DRAWINGS

FIGS. 1A-1G are diagrams of one or more example implementations described herein.

FIG. 3 is a diagram of example components of one or more devices of FIG. 2.

FIG. 4 is a flow chart of an example process for identifying locations of deployed fiber cables based on vibrations.

DETAILED DESCRIPTION OF PREFERRED EMBODIMENTS

Figure 1A:
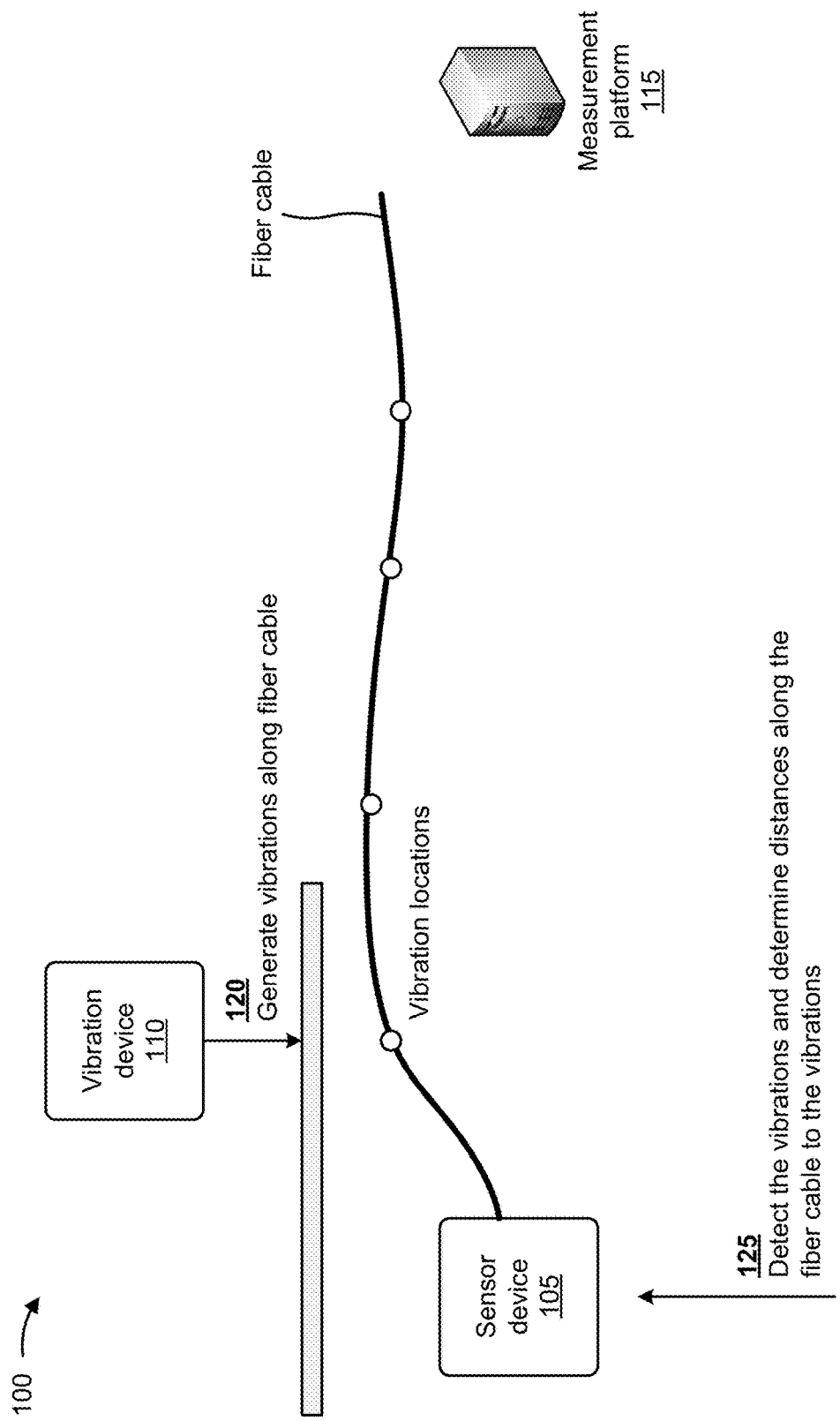

The following detailed description of example implementations refers to the accompanying drawings. The same reference numbers in different drawings may identify the same or similar elements.

Current techniques do not accurately identify locations of a deployed fiber cable. Thus, when a fault occurs in the fiber cable, a field technician may not quickly identify a location of the fault and may not quickly travel to the location and correct the fault in the fiber cable. Current techniques fail to identify locations of deployed fiber cable for several reasons. For example, to identify a location of a fault in a fiber cable, a technician may utilize an optical time-domain reflectometer (OTDR) to measure cable distance from a central office to the location of the fault. However, the cable distance measured by the OTDR fails to provide a geographical location between the central office and the location of the fault. Moreover, the distance measured by the OTDR cannot be accurately correlated to a geographic location, because each deployed fiber cable may include uncertain amounts of localized path deviations or spare cable looping (e.g., slack) along deployed routes. A difference between a geographic location derived from the OTDR-measured cable distance based on a route layout and the actual geographical location may be very large. Therefore, a lot of guesswork may be involved in identifying a particular location of a fault in a fiber cable, which results in wasted time in finding the right location to inspect/repair, as well as potential additional cost in destruction/reconstruction of areas around the fiber cable simply to identify the correct location of the fault. Thus, current techniques for identifying locations of deployed fiber cable waste computing resources (e.g., processing resources, memory resources, communication resources, and/or the like), networking resources, transportation resources, human resources, and/or the like associated with identifying an incorrect location of a fault in a fiber cable, traveling to the incorrect location, accessing the fiber cable underground at the incorrect location, re-identifying a correct location of the fault in the fiber cable, recovering lost network traffic, and/or the like.

Some implementations described herein provide a measurement platform for identifying locations of a deployed fiber cable based on vibrations. For example, the measurement platform may receive, from a sensor device, cable distance data identifying one or more cable distances along the fiber cable to one or more vibrations experienced by the fiber cable, where the one or more vibrations may be generated by a vibration device along a deployed route of the fiber cable. The measurement platform may also receive location data identifying the location of the vibration device, and may correlate the cable distance data and the location data to generate correlated location data for the fiber cable. The measurement platform may store the correlated location data in a data structure associated with the measurement platform. In the event of an alarm condition (e.g., a fault) associated with the fiber cable, a sensor device may determine a cable distance to the alarm condition, and the measurement platform may receive data identifying the cable distance to the alarm condition. The measurement platform may determine a location of the alarm condition based on the correlated location data and using the data identifying the cable distance along the fiber cable to the alarm condition. The measurement platform may also perform one or more actions based on the location of the alarm condition.

In this way, the measurement platform may quickly identify a location of a fault in a fiber cable so that an action may be taken to avoid the fault and/or service the fault in the fiber cable. Thus, the measurement platform conserves computing resources, networking resources, transportation resources, human resources, and/or the like that would otherwise have been wasted in identifying an incorrect location of a fault in a fiber cable, traveling to the incorrect location, re-identifying a correct location of the fault in the fiber cable, recovering lost network traffic, and/or the like.

FIGS. 1A-1G are diagrams of one or more example implementations 100 described herein. As shown in FIG. 1A, a sensor device 105 may be associated with a vibration device 110 and a measurement platform 115. A fiber cable may be associated with sensor device 105. A vibration device 110 may be deployed at locations along a path of the fiber cable.

As further described below, sensor device 105 may include optical devices, such as a distributed optical fiber sensing device (e.g., a Rayleigh scattering based distributed optical fiber acoustic sensing device), an optical reflectometry device (e.g., an optical time-domain reflectometry (OTDR) device), a computer, and/or the like that may sense vibrations in fiber cables caused by vibration device 110. As further described below, vibration device 110 may include a mechanical vibration exciter, an electrodynamic vibration exciter, electrohydraulic vibration exciter, an electromagnetic vibration exciter, a computer, and/or the like that generates vibrations along the paths of the fiber cable. As further described below, measurement platform 115 may include a platform that identifies locations of a deployed fiber cable based on information received from sensor device 105 and associated with the vibration device 110, as described herein.

As further shown in FIG. 1A, and by reference number 120, vibration device 110 may generate vibrations along deployed paths of a fiber cable. For example, vibration device 110 may generate a vibration at a first location of a deployed path of the fiber cable, and then may move to a second location of the deployed path of the fiber cable. Vibration device 110 may generate a vibration at the second location of the deployed path of the fiber cable, and may then be moved to a third location of the deployed path of the fiber cable. This process may repeat until vibrations are generated by vibration device 110 along all selected locations along the deployed path of the fiber cable. The locations may be selected, for example, depending on accessibility of the fiber cable to vibration device 110, based on minimum/maximum distances between locations, or based on another selection technique.

As further shown in FIG. 1A, and by reference number 125, sensor device 105 may detect the vibrations generated along the deployed paths of the fiber cable, and may determine distances along the fiber cable to the vibrations. For example, sensor device 105 may provide a first optical signal (e.g., light) to the fiber cable while a first vibration event is occurring, and the first optical signal may be (at least partially) reflected back to sensor device 105 from a first location of a deployed path of the fiber cable where the first vibration is applied. Sensor device 105 may detect (using the distributed optical sensing device), the first optical signal reflected back from the first location to sensor device 105 and may determine a first cable distance from the first location to a location of sensor device 105 (for example, based on the speed of light through the fiber cable and based on the first optical signal reflected back from the first location to sensor device 105). Sensor device 105 may provide a second optical signal to the fiber cable while a second vibration event is occurring, and the second optical signal may be reflected back to sensor device 105 from a second location of the deployed path of the fiber cable where the second vibration is applied. Sensor device 105 may detect the second optical signal reflected back from the second location to sensor device 105, and may determine a second cable distance from the second location to the location of sensor device 105. This process may repeat until cable distances are determined by sensor device 105 for one or more locations along the deployed path of the fiber cable where vibrations are applied.

The vibration and measurement process may be performed while communications traffic is being carried by the fiber optic cable, as the vibrations experienced by the fiber cable do not prevent the transmission of optical signals between the endpoints of the fiber cable. Moreover, no modifications need to be made to the surroundings of the fiber cable (e.g., excavation, unmouting, rehanging) or the cable itself (e.g., cutting, splicing) in order to obtain the reflected optical signals used for the cable distance measurement, as the vibrations experienced by the cable create the conditions for optical reflection (e.g., back scattering) that may be used by the distributed optical fiber sensing device to measure cable distance. In some implementations, the optical signals used to perform cable measurements may use wavelengths that are outside those used for carrying communications traffic. Thus the fiber cable location processes and systems described herein effectively obtain fiber location data without impacting the operation of the fiber cable or the environment around the fiber cable.

Figure 1B:
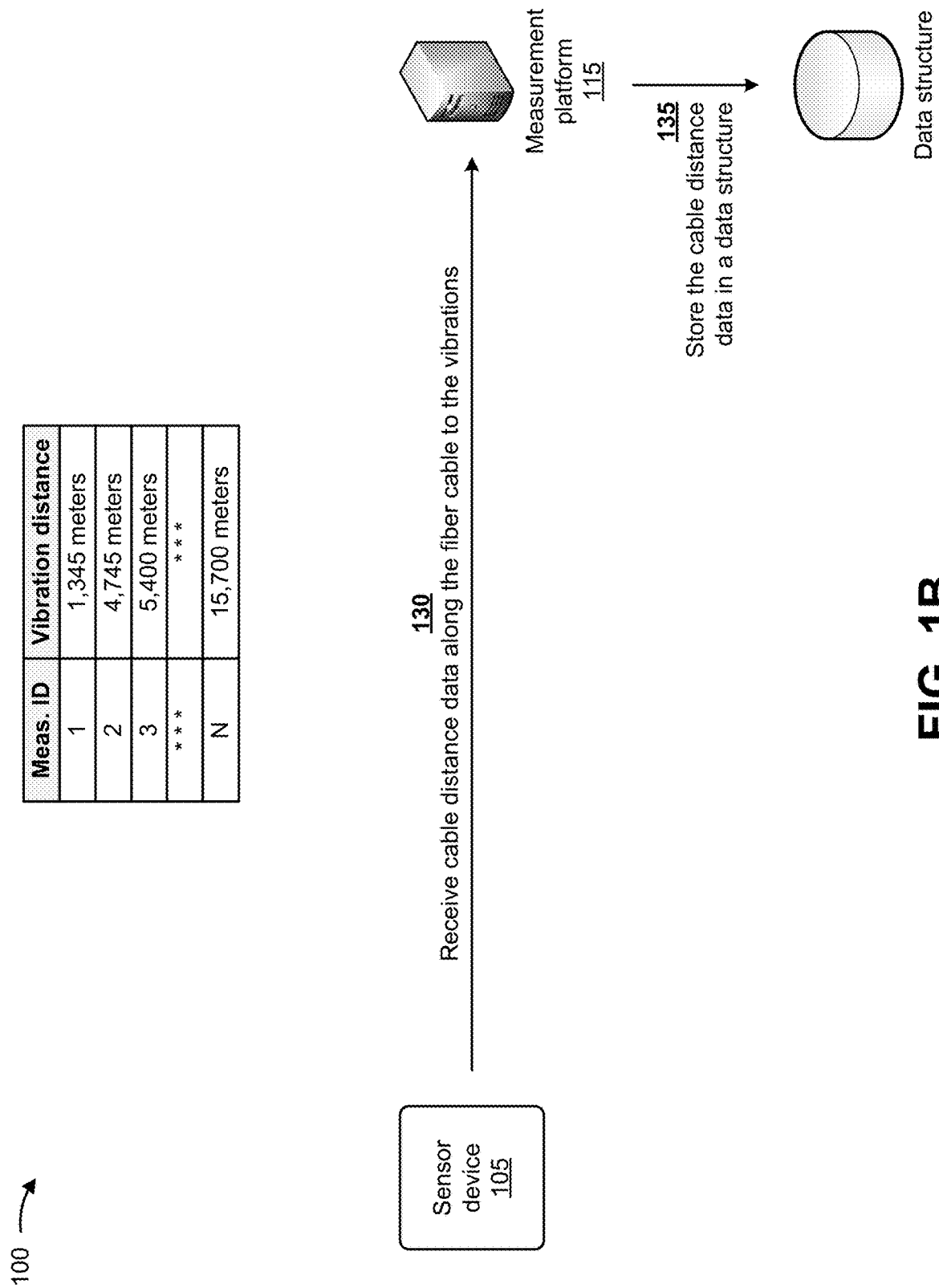

As shown in FIG. 1B, and by reference number 130, measurement platform 115 may receive, for example, from sensor device 105, cable distance data identifying corresponding distances along the fiber cable to the vibrations. In some embodiments, the cable distance data may also include measurement identifiers (IDs) that identify, for example, a number of the measurement made on the fiber cable, and the data identifying corresponding cable distances from the location of sensor device 105 to the vibration location may be associated with the measurement number. For example, as shown in FIG. 1B, the cable distance data may be represented as a table with a measurement ID field that includes entries for measurement IDs (measurement 1, 2, 3, . . . , N) and a vibration distance field that includes entries for corresponding cable distances along the fiber cable from sensor device 105 to each detected vibration (e.g., 1,345 meters, 4,745 meters, 15,700 meters, and/or the like).

As further shown in FIG. 1B, and by reference number 135, measurement platform 115 may store the cable distance data in a data structure (e.g., a database, a table, a list, and/or the like) associated with measurement platform 115. In some implementations, the cable distance data is collected once by sensor device 105, provided to measurement platform 115, and stored in the data structure. Alternatively, if the deployed route of the fiber cable is updated, sensor device 105 and vibration device 110 may repeat the process described above in order to collect updated cable distance data for the fiber cable. Sensor device 105 may provide the updated cable distance data to measurement platform 115, and measurement platform 115 may replace the cable distance data for the fiber cable with the updated cable distance data for the fiber cable.

Figure 1C:
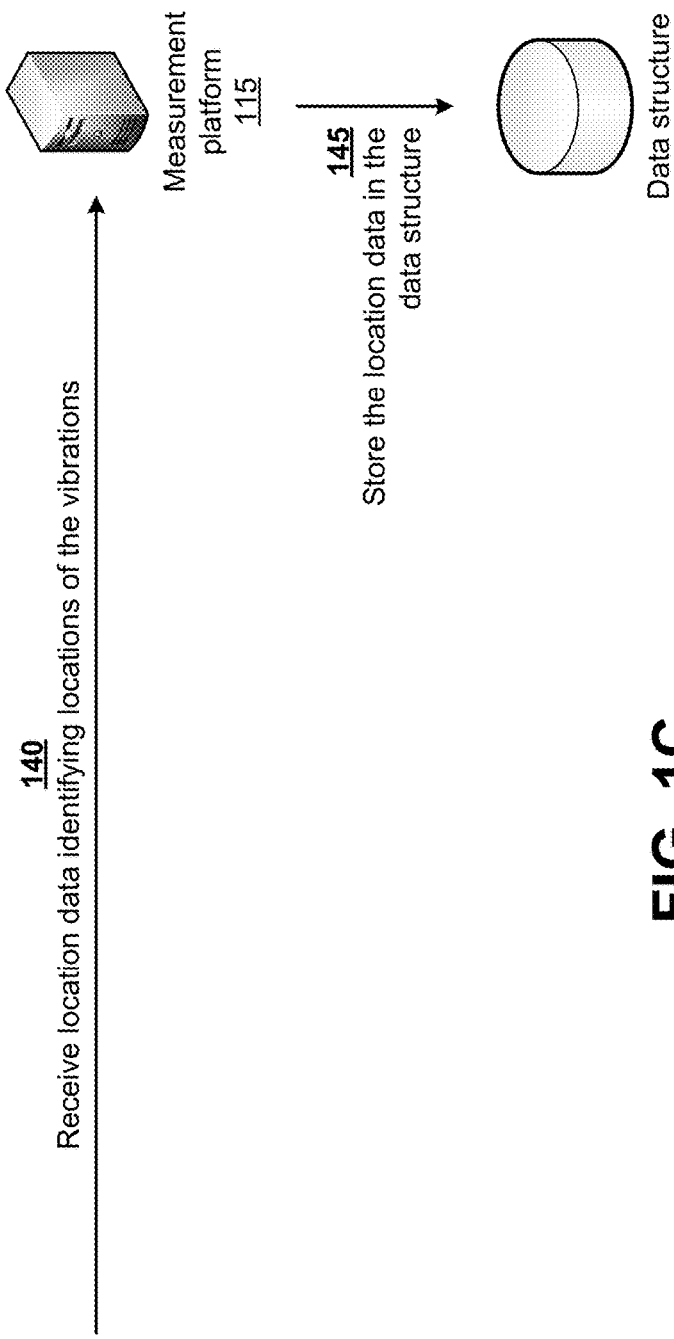

As shown in FIG. 1C, and by reference number 140, measurement platform 115 may receive location data identifying locations of the vibrations (e.g., locations where a vibration event occurred). In some implementations, the locations of the vibrations are provided contemporaneously with the measurements of cable distance data by sensor device 105. In some implementations, the locations of the vibrations are provided at some time after the measurements of cable distance data by sensor device 105 have been obtained (e.g., after all the vibration locations have been measured).

In some implementations, the location data may include measurement identifiers (IDs) that identify a measurement number of a measurement taken during a vibration event at a vibration location, and the data identifying locations of the vibrations during the measurements may be associated with the measurement numbers. For example, as shown in FIG. 1C, the location data may be represented as a table with a measurement ID field that includes entries for measurement IDs of the measurements taken (e.g., measurements 1, 2, 3, . . . , N) and a location field that includes entries for a corresponding geographical location associated with the location of each of the vibration events during the measurements (e.g., "345 Main Street", "Vault 17", "Pole 34-536", and/or the like).

As further shown in FIG. 1C, and by reference number 145, measurement platform 115 may store the location data in the data structure associated with measurement platform 115. In some implementations, the location data is provided once to measurement platform 115, and stored in the data structure. Alternatively, if the deployed route of the fiber cable is updated, sensor device 105 and vibration device 110 may repeat the process described above in order to collect updated location data for the fiber cable. Updated location data may be provided to measurement platform 115, and measurement platform 115 may replace the location data for the fiber cable with the updated location data for the fiber cable.

Figure 1D:
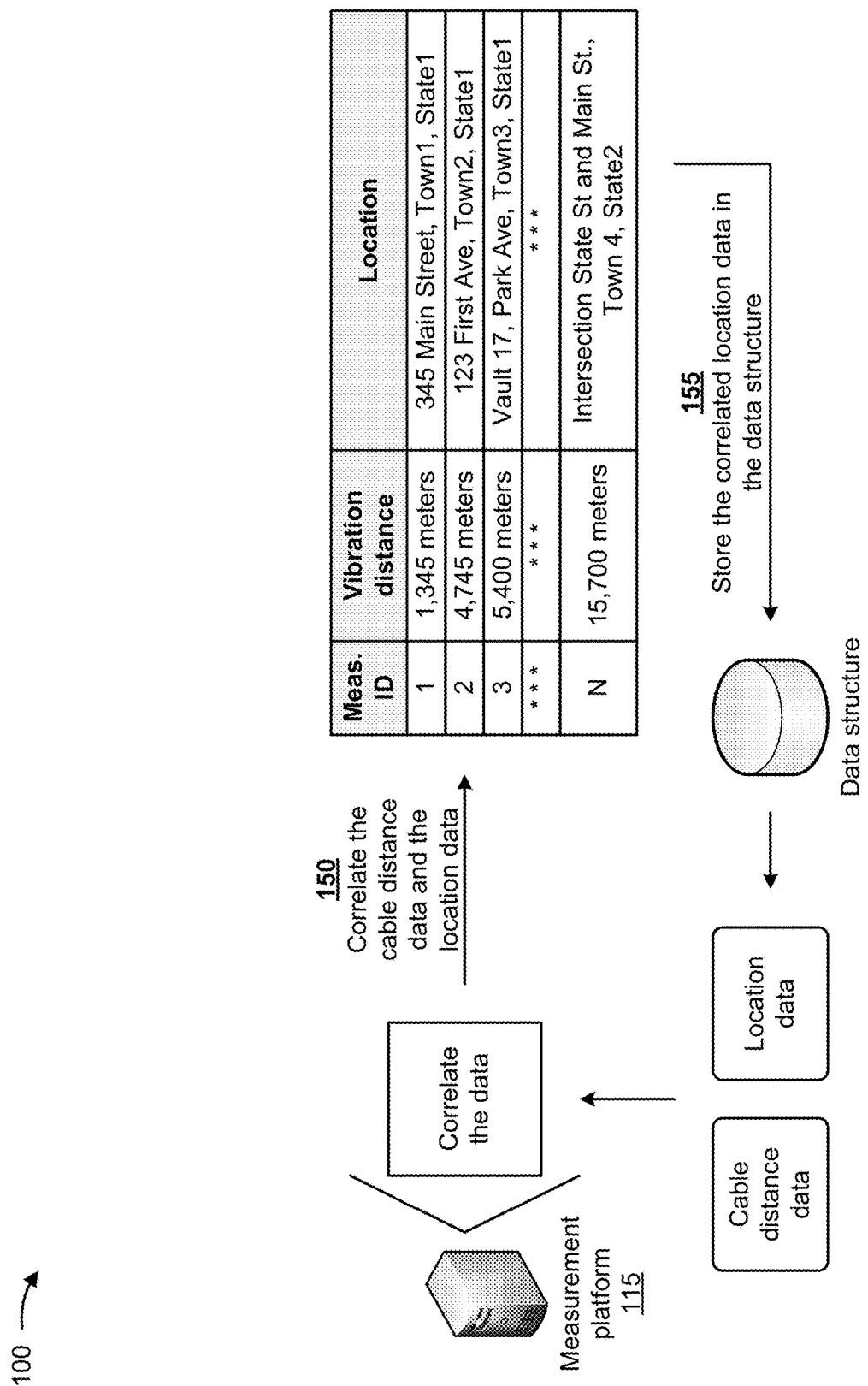

As shown in FIG. 1D, and by reference number 150, measurement platform 115 may correlate the cable distance data and the location data to generate correlated location data. For example, measurement platform 115 may create a data structure that merges the vibration distance field of the cable distance data with the location field of the location data, using the measurement ID to do the correlation. The created data structure may correspond to the correlated location data. As shown, the correlated location data may be represented as a table with a vibration distance field that includes entries for corresponding cable distances along the fiber cable to vibrations (e.g., 1,345 meters, 4,745 meters, 15,700 meters, and/or the like) and a location field that includes entries for corresponding geographical locations associated with the vibrations of the fiber cable (e.g., "345 Main Street", "Vault 17", "Pole 34-536", and/or the like). In some implementations, a measurement ID field may also be included in the correlated location data, indicating the measurement identifier associated with the cable distance and location.

As further shown in FIG. 1D, and by reference number 155, measurement platform 115 may store the correlated location data in the data structure associated with measurement platform 115. In some implementations, the correlated location data is determined once by measurement platform 115, and stored in the data structure. Alternatively, if the deployed route of the fiber cable is updated, sensor device 105 and vibration device 110 may repeat the process described above in order to collect updated cable distance data and updated location data for the fiber cable. Sensor device 105 may provide the updated cable distance data to measurement platform 115, and updated location data associated with the deployment and activation of vibration device 110 to measurement platform 115. Measurement platform 115 may determine updated correlated location data for the fiber cable based on the updated cable distance data and the updated location data. Measurement platform 115 may replace the correlated location data for the fiber cable with the updated correlated location data for the fiber cable.

Figure 1E:
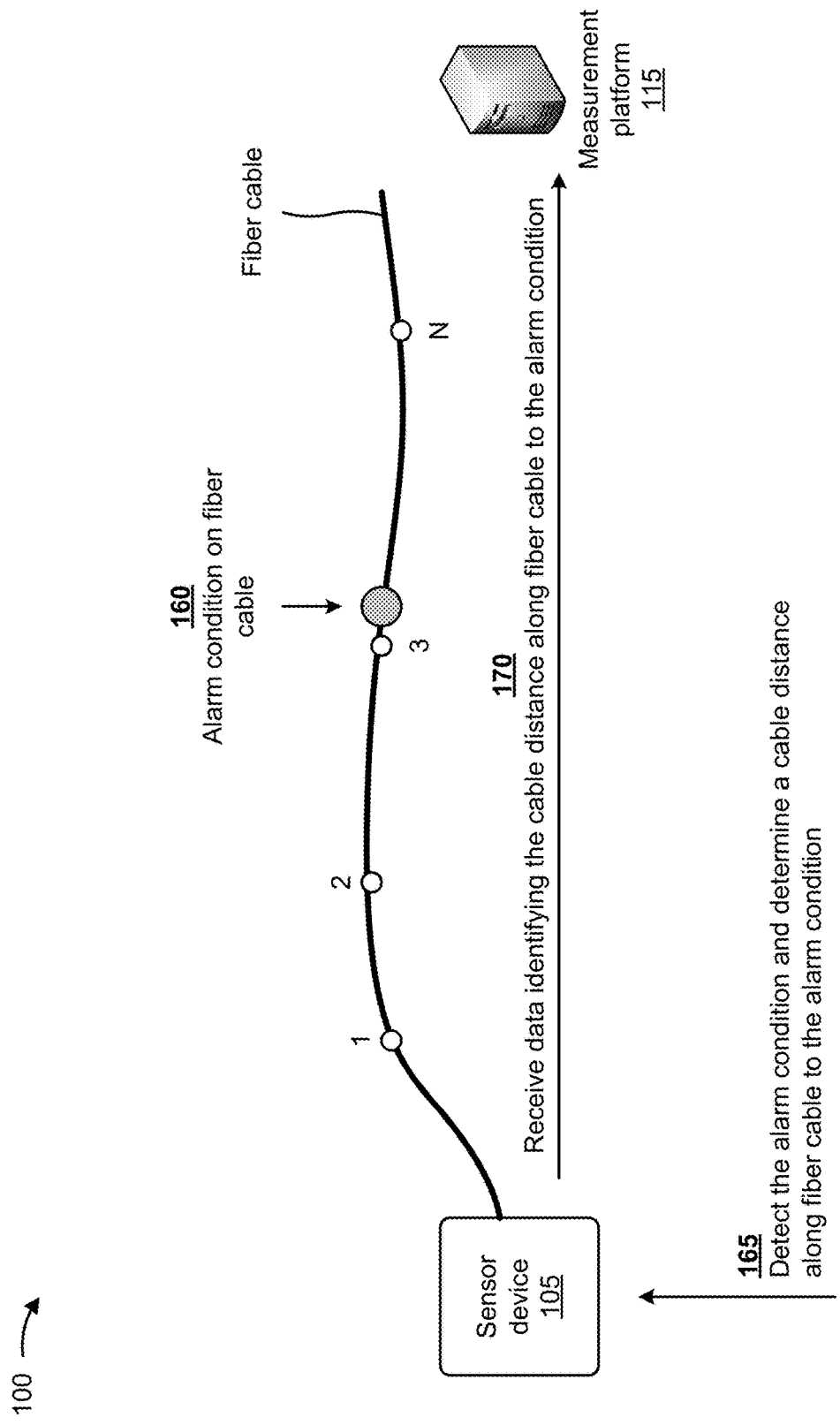

As shown in FIG. 1E, and by reference number 160, an alarm condition may occur in the fiber cable. The alarm condition may be a result of a fiber cut, a high loss splice point, a tightly bending point, and/or the like associated with the fiber cable. For purposes of this example, if different cable distances along the fiber cable are labeled "1" through "N," the alarm condition may occur at a cable distance (e.g., from sensor device 105) nearby a location labeled "3." The alarm condition may be detected by a network device (e.g., a network provider server) that manages a network associated with the fiber cable.

As further shown in FIG. 1E, and by reference number 165, as a result of the alarm condition, sensor device 105 may be activated to determine a cable distance along the fiber cable to the cause of the alarm condition. For example, sensor device 105 may provide an optical signal to the fiber cable, and the cause of the alarm condition (e.g., a displacement or a fiber cut) associated with the fiber cable may cause the optical signal to be reflected back to sensor device 105 from a location of the alarm condition. Sensor device 105 may detect the optical signal reflected back from the location of the alarm condition to sensor device 105, and may determine a cable distance from the location of the alarm condition to a location of sensor device 105. In this example, assume the measurement is determined to be 5,500 meters.

As further shown in FIG. 1E, and by reference number 170, measurement platform 115 may receive, from sensor device 105, data identifying the cable distance along the fiber cable to the alarm condition. For example, measurement platform 115 may receive data identifying the detected cable distance from the location of sensor device 105 to the cause of the alarm condition associated with the fiber cable. In this example, the measurement of 5,500 meters would be provided to the measurement platform.

As shown in FIG. 1F, and by reference number 175, measurement platform 115 may determine a location of the alarm condition based on the correlated location data and the data identifying the cable distance along the fiber cable to the alarm condition. Continuing with the current example, where the cable distance along the fiber cable to the alarm condition is determined to be 5,500 meters, measurement platform 115 may use the information of the correlated location data to determine a geographic location closest to the alarm condition—in this case, "Vault 17, Park Ave., Town3, State1." In some implementations, measurement platform 115 may also provide a cable distance from the location determined from the correlated location data from which the actual measurement can most likely be found. Continuing the current example, measurement platform 115 may provide not only the geographic location of "Vault 17, Park Ave., Town3, State1," but also "+100 meters" to indicate that the alarm condition is likely located 100 meters beyond the geographic location.

Figure 1G:
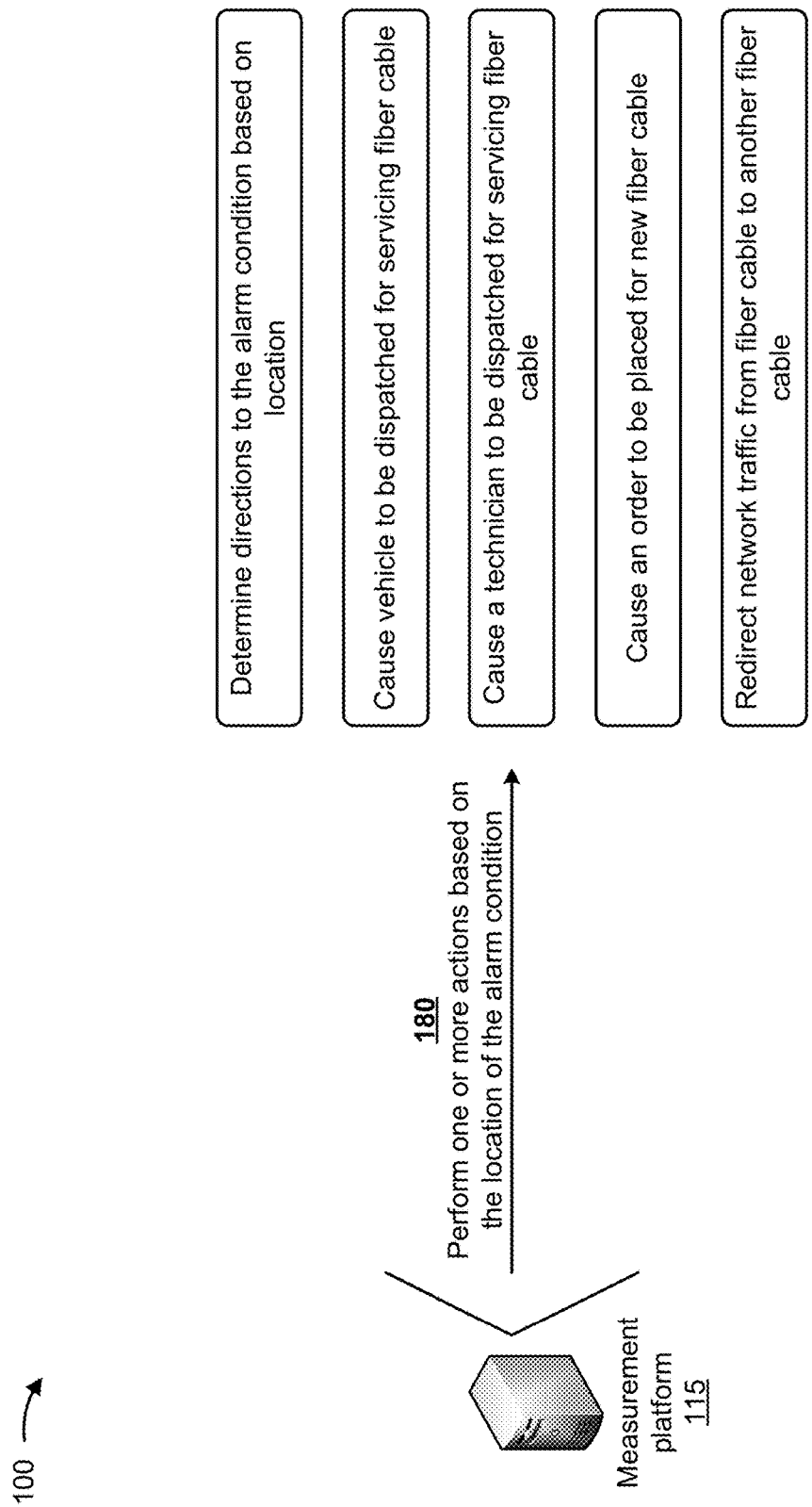

As shown in FIG. 1G, and by reference number 180, based on the determined geographic location of the cause of the alarm condition, measurement platform 115 may perform one or more actions. In some implementations, the one or more actions include measurement platform 115 determining directions (e.g., a navigation route) to the cause of the alarm condition based on the location of the alarm condition. For example, if measurement platform 115 determines that the alarm condition is located at "Vault 17, Park Ave., Town3, State1," measurement platform 115 may calculate directions to the alarm condition, for example, from the fiber cable origination point, a nearby service center, or other starting point. In this way, measurement platform 115 may quickly provide directions to a technician and/or a vehicle for repairing the fiber cable, which conserves resources that would otherwise have been wasted in manually determining directions to the technician and/or the vehicle, causing the technician and/or the vehicle to travel based on potentially incorrect directions, and/or the like.

In some implementations, the one or more actions include measurement platform 115 causing a vehicle to be dispatched for servicing the fiber cable. For example, measurement platform 115 may cause an autonomous automobile (e.g., a car, a truck, a van, and/or the like) to be dispatched for servicing the fiber cable. In this way, measurement platform 115 may utilize existing land routes and infrastructure to service the fiber cable, thereby conserving resources (e.g., computing resources, networking resources, and/or the like) that would otherwise have been wasted in scheduling a repair service, assigning a technician for the repair service, and/or the like.

In some implementations, the one or more actions include measurement platform 115 causing an airborne autonomous vehicle to be dispatched for servicing the fiber cable. For example, measurement platform 115 may cause an unmanned aerial vehicle to be dispatched for servicing the fiber cable. In this way, measurement platform 115 may service the fiber cable at locations that may be restricted by automobile traffic, traffic controls, inaccessible roadways, unnavigable terrain, and/or the like, thereby conserving resources that would otherwise would have been wasted servicing the fiber cable at the locations in a more expensive or more time-consuming manner (e.g., with larger and/or heavier vehicles, slower vehicles, less direct routes, and/or the like).

In some implementations, the one or more actions include measurement platform 115 causing a technician to be dispatched for servicing the fiber cable. For example, measurement platform 115 may automatically identify an available technician nearest to the alarm condition and may instruct the technician to travel to the alarm condition and service the fiber cable. In this way, measurement platform 115 may enable servicing of the fiber cable, thereby conserving resources (e.g., computing resources, networking resources, and/or the like) that would otherwise have been wasted in scheduling a repair service, assigning a technician for the repair service, and/or the like.

In some implementations, the one or more actions include measurement platform 115 causing an order for new fiber cable to be placed for repairing the fiber cable. For example, measurement platform 115 may automatically invoke a provider of fiber cable to deliver the new fiber cable to the location of the alarm condition. In some implementations, measurement platform 115 may cause the new fiber cable to be autonomously delivered to the location of the alarm condition. In this way, measurement platform 115 may automatically cause the new fiber cable to be provided at the location that requires the new fiber cable for repairing the fiber cable.

In some implementations, the one or more actions include measurement platform 115 redirecting network traffic from the fiber cable to another fiber cable. For example, measurement platform 115 may identify network traffic associated with the fiber cable, and may identify another fiber cable that is available and can handle the network traffic. Measurement platform 115 may then redirect the network traffic to the other fiber cable. In this way, measurement platform 115 may temporarily utilize the other fiber cable for the network traffic, thereby conserving resources that would otherwise have been wasted in identifying lost network traffic, attempting to recover the lost network traffic, and/or the like.

The one or more actions may include the measurement platform 115 providing the location of the alarm condition to a requesting system or as part of an alerting message or other transmission. The location of the alarm condition may, in some implementations, include the geographic location and an additional distance from the geographic location.

In this way, several different stages of the process for identifying locations of deployed fiber cables are automated and performed without disruption to physical environment or network operations, which may remove waste from the process, and improve speed and efficiency of the process and conserve computing resources (e.g., processing resources, memory resources, communication resources, and/or the like), networking resources, and/or the like. Furthermore, implementations described herein use a rigorous, computerized process to perform tasks or roles that were not previously performed or were previously performed using subjective human intuition or input. For example, currently there does not exist a technique that accurately identifies locations of deployed fiber cables in the manner described herein. Finally, the process for identifying locations of deployed fiber cables conserves computing resources, networking resources, transportation resources, human resources, and/or the like that would otherwise have been wasted in identifying an incorrect location of a fault in a fiber cable, traveling to the incorrect location, re-identifying a correct location of the fault in the fiber cable, recovering lost network traffic, and/or the like.

As indicated above, FIGS. 1A-1G are provided merely as examples. Other examples may differ from what was described with regard to FIGS. 1A-1G. The number and arrangement of devices and networks shown in FIGS. 1A-1G are provided as an example. In practice, there may be additional devices and/or networks, fewer devices and/or networks, different devices and/or networks, or differently arranged devices and/or networks than those shown in FIGS. 1A-1G. Furthermore, two or more devices shown in FIGS. 1A-1G may be implemented within a single device, or a single device shown in FIGS. 1A-1G may be implemented as multiple, distributed devices. Additionally, or alternatively, a set of devices (e.g., one or more devices) of FIGS. 1A-1G may perform one or more functions described as being performed by another set of devices of FIGS. 1A-1G.

Figure 2:
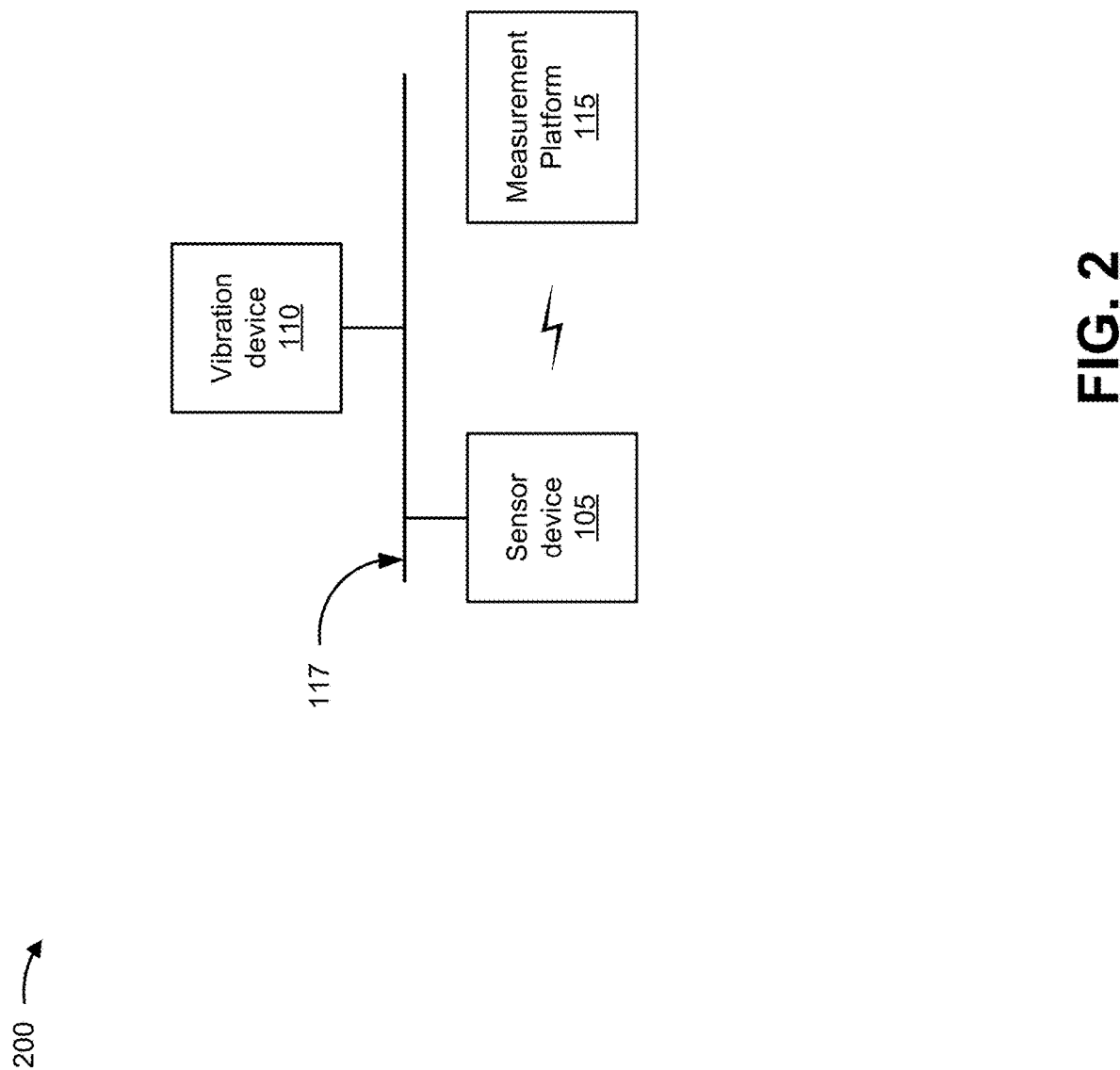
FIG. 2 is a diagram of an example environment in which systems and/or methods described herein may be implemented.

FIG. 2 is a diagram of an example environment 200 in which systems and/or methods described herein may be implemented. As shown in FIG. 2, environment 200 may include sensor device 105, vibration device 110, measurement platform 115 and fiber cable 117. Sensor device 105 may include one or more devices capable of receiving, generating, storing, processing, and/or providing information, such as information described herein. For example, as noted above, sensor device 105 may include optical components, including a distributed optical fiber sensing device—such as a distributed optical fiber acoustic sensing device that uses a fiber cable to provide distributed strain sensing, where the fiber cable is a sensing element and vibration measurements are made using an optoelectronic device. The distributed optical fiber sensing device may include a Rayleigh scattering-based distributed optical fiber acoustic sensing device. Sensor device 105 may further include an optical reflectometry device, such as an optical time-domain reflectometry (OTDR) device. The optical reflectometry device may be used with the distributed optical sensing device to perform acoustical sensing of vibrations applied to and experienced by a fiber optic cable. Sensor device 105 may also include or be associated with a processing system, such as a laptop computer, a tablet computer, a desktop computer, a handheld computer, or a similar type of device, that determines vibration measurements and fiber cable distances to detected vibrations. In some implementations, sensor device 105 may receive information from and/or transmit information to measurement platform 115 through a communication channel between them.

Vibration device 110 may include a vibration exciter that produces a mechanical motion to vibrate a test object (e.g., a fiber cable, such as fiber cable 117), and that produces a range of harmonic or time-dependent excitation forces and/or displacements through a range of frequencies. Vibration device may be controllable to vary the frequency, intensity, or other characteristics of the vibrations created. Vibration device 110 may include a mechanical vibration exciter, an electrodynamic vibration exciter, electrohydraulic vibration exciter, an electromagnetic vibration exciter, and/or the like. Vibration device 110 may generate vibrations along paths of fiber cables. Vibration device 110 may also include or be associated with a laptop computer, a tablet computer, a desktop computer, a handheld computer, or a similar type of device that determines locations associated with the generated vibrations along the paths of the fiber cables.

Measurement platform 115 includes one or more devices that identify locations of deployed fiber cables based on vibrations. For example, measurement platform 115 may include a server device, a laptop computer, a tablet computer, a desktop computer, a group of server devices, or a similar type of device. In some implementations, measurement platform 115 may receive information from and/or transmit information to one or more sensor devices 105 using a communication channel between them.

Fiber cable 117 may be a fiber optic cable used to carry optical communications traffic in the form of optical signals. Fiber cable may be deployed in a route from an origin location (e.g. a central office, a point of presence) to a destination location (e.g., a different central office or point of presence). The fiber cable 117 may be deployed underground or above ground (e.g., using poles or other vertical stanchions). Fiber cable 117 may have various small deviations from its deployment route (e.g., to avoid obstacles or comply with property rights), and may include sections that are spooled into "slack" to enable future repairs or improvements.

The number and arrangement of devices and networks shown in FIG. 2 are provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of environment 200 may perform one or more functions described as being performed by another set of devices of environment 200.

FIG. 3 is a diagram of example components of a device 300. Device 300 may correspond to or be included as part of sensor device 105 and/or measurement platform 115. In some implementations, sensor device 105 and/or measurement platform 115 include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 includes a component that permits communication among the components of device 300. Processor 320 is implemented in hardware, firmware, or a combination of hardware and software. Processor 320 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 320 includes one or more processors capable of being programmed to perform a function. Memory 330 includes a random-access memory (RAM), a read only memory (ROM), and/or another type of dynamic or static storage device (e.g., a flash memory, a magnetic memory, and/or an optical memory) that stores information and/or instructions for use by processor 320.

Storage component 340 stores information and/or software related to the operation and use of device 300. For example, storage component 340 may include a hard disk (e.g., a magnetic disk, an optical disk, a magneto-optic disk, and/or a solid-state disk), a compact disc (CD), a digital versatile disc (DVD), a floppy disk, a cartridge, a magnetic tape, and/or another type of non-transitory computer-readable medium, along with a corresponding drive.

Input component 350 includes a component that permits device 300 to receive information, such as via user input (e.g., a touch screen display, a keyboard, a keypad, a mouse, a button, a switch, and/or a microphone). Additionally, or alternatively, input component 350 may include a sensor for sensing information (e.g., a global positioning system (GPS) component, an accelerometer, a gyroscope, and/or an actuator). Output component 360 includes a component that provides output information from device 300 (e.g., a display, a speaker, and/or one or more light-emitting diodes (LEDs)).

Communication interface 370 includes a transceiver-like component (e.g., a transceiver and/or a separate receiver and transmitter) that enables device 300 to communicate with other devices, such as via a wired connection, a wireless connection, or a combination of wired and wireless connections. Communication interface 370 may permit device 300 to receive information from another device and/or provide information to another device. For example, communication interface 370 may include an Ethernet interface, an optical interface, a coaxial interface, an infrared interface, a radio frequency (RF) interface, a universal serial bus (USB) interface, a Wi-Fi interface, a cellular network interface, and/or the like.

Device 300 may perform one or more processes described herein. Device 300 may perform these processes based on processor 320 executing software instructions stored by a non-transitory computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

FIG. 4 is a flow chart of an example process 400 for identifying locations of deployed fiber cables based on vibrations. In some implementations, one or more process blocks of FIG. 4 may be performed by a device (e.g., measurement platform 115). In some implementations, one or more process blocks of FIG. 4 may be performed by another device or a group of devices separate from or including the device, such as a sensor device (e.g., sensor device 105).

As shown in FIG. 4, process 400 may include receiving, from a sensor device, cable distance data for one or more cable distances along the fiber cable to vibrations experienced by the fiber cable (block 410). For example, the device (e.g., using processor 320, communication interface 370, and/or the like) may receive, from a sensor device, cable distance data identifying a cable distance along the fiber cable to one or more vibrations experienced by the fiber cable, as described above. In some implementations, the vibrations are generated by a vibration device located along a deployed route of the fiber cable. The sensor device may include optical devices such as a distributed optical fiber sensing device and optical reflectometry device that communicate with the fiber cable and detect the vibrations experienced by the fiber cable. The vibration device may include a vibration exciter that produces a mechanical motion that produces a range of harmonic or time-dependent excitation forces or displacements through a range of frequencies.

As further shown in FIG. 4, process 400 may include receiving location data identifying a geographic location of locations associated with the vibrations (block 420). For example, the device (e.g., using processor 320, memory 330, communication interface 370, and/or the like) may receive location data identifying location data for the locations associated with the vibration events, as described above.

As further shown in FIG. 4, process 400 may include correlating the cable distance data and the location data to generate correlated location data (block 430). For example, the device (e.g., using processor 320, storage component 340, and/or the like) may correlate the cable distance data and the location data to generate correlated location data, as described above. In some implementations, correlating the cable distance data and the location data to generate the correlated location data includes correlating data identifying the cable distances to the geographic locations associated with the vibrations, for example using the measurement identifiers.

As further shown in FIG. 4, process 400 may include storing the correlated location data in a data structure associated with the device (block 440). For example, the device (e.g., using processor 320, memory 330, storage component 340, and/or the like) may store the correlated location data in a data structure associated with the device, as described above.

As further shown in FIG. 4, process 400 may include receiving, from the sensor device, data identifying a cable distance along the fiber cable to an alarm condition associated with the fiber cable (block 450). For example, the device (e.g., using processor 320, communication interface 370, and/or the like) may receive, from the sensor device, data identifying a cable distance along the fiber cable to an alarm condition associated with the fiber cable, as described above. The alarm condition may be associated with, for example, a fiber cut in the fiber cable or other fault in the fiber cable.

As further shown in FIG. 4, process 400 may include determining a location of the alarm condition based on the correlated location data (block 460). For example, the device (e.g., using processor 320, memory 330, and/or the like) may determine a location of the alarm condition based on the correlated location data. The data identifying the cable distance along the fiber cable to the alarm condition may be used to determine a closest geographic location from the correlated location data, as described above. The geographic location may be provided, and in some implementations may include a likely distance from the geographic location.

As further shown in FIG. 4, process 400 may include performing one or more actions based on the location of the alarm condition (block 470). For example, the device (e.g., using processor 320, memory 330, storage component 340, communication interface 370, and/or the like) may perform one or more actions based on the location of the alarm condition, as described above. In some implementations, performing the one or more actions includes determining directions to the alarm condition based on the location of the alarm condition; causing a ground autonomous vehicle to be dispatched for servicing the fiber cable; causing an airborne autonomous vehicle to be dispatched for servicing the fiber cable; causing a technician to be dispatched for servicing the fiber cable; causing an order for new fiber cable to be placed for repairing the fiber cable; or redirecting network traffic from the fiber cable to another fiber cable.

In some implementations, performing the one or more actions includes identifying another fiber cable that is operational and capable of receiving network traffic from the fiber cable, and redirecting the network traffic from the fiber cable to the other fiber cable. In some implementations, performing the one or more actions includes determining directions to the alarm condition based on the location of the alarm condition, and providing the directions to an autonomous vehicle to enable the autonomous vehicle to be dispatched for servicing the fiber cable.

Process 400 may include additional implementations, such as any single implementation or any combination of implementations described below and/or in connection with one or more other processes described elsewhere herein.

In some implementations, process 400 includes storing the cable distance data and the location data in the data structure associated with the device.

In some implementations, process 400 includes receiving, from the sensor device, updated cable distance data along the fiber cable to one or more new vibration locations of the fiber cable; receiving updated location data identifying locations associated with the one or more new vibrations; correlating the updated cable distance data and the updated location data to generate updated correlated location data; and replacing the correlated location data with the updated correlated location data.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

The foregoing disclosure provides illustration and description, but is not intended to be exhaustive or to limit the implementations to the precise form disclosed. Modifications and variations may be made in light of the above disclosure or may be acquired from practice of the implementations.

As used herein, the term "component" is intended to be broadly construed as hardware, firmware, or a combination of hardware and software.

To the extent the aforementioned implementations collect, store, or employ personal information of individuals, it should be understood that such information shall be used in accordance with all applicable laws concerning protection of personal information. Additionally, the collection, storage, and use of such information can be subject to consent of the individual to such activity, for example, through well known "opt-in" or "opt-out" processes as can be appropriate for the situation and type of information. Storage and use of personal information can be in an appropriately secure manner reflective of the type of information, for example, through various encryption and anonymization techniques for particularly sensitive information.

It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware may be designed to implement the systems and/or methods based on the description herein.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A method, comprising:
    receiving, by a device and from a sensor device, cable distance data identifying at least one cable distance along a fiber cable to a corresponding at least one vibration experienced by the fiber cable,
        wherein the at least one vibration is generated by a vibration device along a deployed route of the fiber cable;
    receiving, by the device, location data identifying at least one location associated with the at least one vibration;
    correlating, by the device, the cable distance data and the location data to generate correlated location data;
    storing, by the device, the correlated location data in a data structure associated with the device;
    receiving, by the device and from the sensor device, data identifying a cable distance along the fiber cable to an alarm condition associated with the fiber cable;
    determining, by the device, a location of the alarm condition based on the correlated location data and the data identifying the cable distance along the fiber cable to the alarm condition; and
    performing, by the device, one or more actions based on the location of the alarm condition,
        wherein performing the one or more actions comprises:
            providing directions to an autonomous vehicle based on the location of the alarm condition.

2. The method of claim 1, wherein providing directions to the autonomous vehicle based on the location of the alarm condition comprises one or more of:
    providing directions to a ground autonomous vehicle to be dispatched for servicing the fiber cable; or
    providing direction to an airborne autonomous vehicle to be dispatched for servicing the fiber cable.

3. The method of claim 1, wherein performing the one or more actions comprises one or more of:
    causing a technician to be dispatched for servicing the fiber cable;
    causing an order for new fiber cable to be placed for repairing the fiber cable; or
    redirecting network traffic from the fiber cable to another fiber cable.

4. The method of claim 1, wherein performing the one or more actions comprises:
    identifying another fiber cable that is operational and capable of receiving network traffic from the fiber cable; and
    redirecting the network traffic from the fiber cable to the other fiber cable.

5. The method of claim 1, wherein performing the one or more actions comprises:
    determining the directions,
        the directions being directions to the alarm condition based on the location of the alarm condition; and
    providing the directions to the autonomous vehicle to enable the autonomous vehicle to be dispatched for servicing the fiber cable.

6. The method of claim 1, wherein the alarm condition is associated with one of a fiber cut in the fiber cable or a fault in the fiber cable.

7. The method of claim 1, further comprising:
    storing the cable distance data and the location data in the data structure associated with the device.

8. A device, comprising:
    one or more memories; and
    one or more processors, communicatively coupled to the one or more memories, configured to:
        receive, from a sensor device, cable distance data identifying a measurement identifier and at least one cable distance along a fiber cable to a at least one vibration experienced by the fiber cable,
            wherein the at least one vibration is generated by a vibration device along a deployed route of the fiber cable;
        receive location data identifying the measurement identifier and at least one corresponding location associated with the at least one vibration;
        correlate the cable distance data and the location data to generate correlated location data;
        store the correlated location data in the one or more memories;
        receive, from the sensor device, data identifying a cable distance along the fiber cable to an alarm condition associated with the fiber cable;
        determine a location of the alarm condition based on the correlated location data and the data identifying the cable distance along the fiber cable to the alarm condition; and
        perform one or more actions based on the location of the alarm condition,
            wherein the one or more processors, when performing the one or more actions, are to:
                provide directions to an autonomous vehicle based on the location of the alarm condition.

9. The device of claim 8, wherein the sensor device includes a Rayleigh scattering-based distributed acoustic sensing device.

10. The device of claim 8, wherein the vibration device includes a vibration exciter that produces a mechanical motion that produces a range of harmonic or time-dependent excitation forces or displacements through a range of frequencies.

11. The device of claim 8, wherein the one or more processors, when correlating the cable distance data and the location data to generate the correlated location data, are configured to:
  correlate data identifying the at least one location associated with the at least one vibration and data identifying the at least one corresponding cable distance along the fiber cable to the at least one vibration to generate the correlated location data.

12. The device of claim 8, wherein the one or more processors, when performing the one or more actions, are configured to:
  provide the location of the alarm condition,
    wherein the location of the alarm condition includes a geographic location and a distance from the geographic location.

13. The device of claim 8, wherein the one or more processors are further configured to:
  receive, from the sensor device, updated cable distance data identifying at least one updated cable distance along the fiber cable to at least one new vibration experienced by the fiber cable;
  receive updated location data identifying at least one updated location associated with the at least one new vibration;
  correlate the updated cable distance data and the updated location data to generate updated correlated location data; and
  replace the correlated location data with the updated correlated location data.

14. The device of claim 8, wherein the sensor device includes an optoelectronic device that communicates with the fiber cable and detects the at least one vibration experienced by the fiber cable.

15. A non-transitory computer-readable medium storing instructions, the instructions comprising:
  one or more instructions that, when executed by one or more processors of a device, cause the one or more processors to:
    receive, from a sensor device, cable distance data identifying at least one cable distance along a fiber cable to a corresponding at least one vibration experienced by the fiber cable,
      wherein the at least one vibration is generated by a vibration device along a deployed route of the fiber cable;
    receive location data identifying at least one location associated with the at least one vibration;
    correlate the cable distance data and the location data to generate correlated location data;
    store the correlated location data in a data structure associated with the device;
    receive, from the sensor device, data identifying a cable distance along the fiber cable to an alarm condition associated with the fiber cable;
    determine a location of the alarm condition based on the correlated location data and the data identifying the cable distance along the fiber cable to the alarm condition; and
    cause one or more of a ground autonomous vehicle or an airborne autonomous vehicle to be dispatched for servicing the fiber cable based on the location of the alarm condition.

16. The non-transitory computer-readable medium of claim 15, wherein the instructions further comprise:
  one or more instructions that, when executed by the one or more processors, cause the one or more processors to one or more of:
    determine directions to the alarm condition based on the location of the alarm condition;
    cause an order for new fiber cable to be placed for repairing the fiber cable; or
    redirect network traffic from the fiber cable to another fiber cable.

17. The non-transitory computer-readable medium of claim 15, wherein the instructions further comprise:
  one or more instructions that, when executed by the one or more processors, cause the one or more processors to one or more of:
    identify another fiber cable that is operational and capable of receiving network traffic from the fiber cable; and
    redirect the network traffic from the fiber cable to the other fiber cable.

18. The non-transitory computer-readable medium of claim 15, wherein the instructions further comprise:
  one or more instructions that, when executed by the one or more processors, cause the one or more processors to one or more of:
    determine directions to the alarm condition based on the location of the alarm condition; and
    provide the directions to one or more of:
      the ground autonomous vehicle to enable the ground autonomous vehicle to be dispatched for servicing the fiber cable, or
      the airborne autonomous vehicle to enable the airborne autonomous vehicle to be dispatched for servicing the fiber cable.

19. The non-transitory computer-readable medium of claim 15, wherein the instructions further comprise:
  one or more instructions that, when executed by the one or more processors, cause the one or more processors to one or more of:
    store the cable distance data and the location data in the data structure associated with the device.

20. The non-transitory computer-readable medium of claim 15, wherein the one or more instructions, that cause the one or more processors to correlate the cable distance data and the location data to generate the correlated location data, cause the one or more processors to:
  correlate data identifying the at least one location associated with the at least one vibration and data identifying the at least one cable distance along the fiber cable to the at least one vibration to generate the correlated location data.

* * * * *